United States Patent [19]
Kebabian et al.

[11] Patent Number: 5,103,453
[45] Date of Patent: Apr. 7, 1992

[54] METHOD AND MEANS FOR CONTROLLING THE FREQUENCY AND POWER OUTPUT OF A TUNABLE DIODE LASER

[75] Inventors: Paul L. Kebabian, Acton; Mark S. Zahniser, Arlington, both of Mass.

[73] Assignee: Aerodyne Research, Inc., Billerica, Mass.

[21] Appl. No.: 654,301

[22] Filed: Feb. 12, 1991

[51] Int. Cl.$^5$ .............................................. H01S 3/10
[52] U.S. Cl. ...................... 372/20; 372/28; 372/38; 372/33; 372/32; 372/22
[58] Field of Search ...................... 372/20, 38, 28, 22, 372/32, 33, 29, 34

[56] References Cited
U.S. PATENT DOCUMENTS
4,410,992  10/1983  Javan .................................. 372/32

Primary Examiner—Leon Scott, Jr.
Attorney, Agent, or Firm—Cesari and McKenna

[57] ABSTRACT

In a laser emitter-receiver system, a tunable diode laser provides a beam of coherent light having a selected frequency. An infrared detector spaced from the source detects the light transmitted along the beam path between the source and the detector and produces a corresponding output in response thereto. A heating laser provides radiation to the diode laser to heat, and thereby to change the frequency of, the latter laser. The radiation from the heating laser is varied periodically to modulate the intensity of the radiation incident on the diode laser thereby to frequency-modulate the diode laser output over a selected tuning range. A controller responsive to the detector output regulates the current to the diode laser to minimize selected frequency components of the modulated light beam from that laser so that the power output of the diode laser varies minimally when that laser is tuned over the selected tuning range.

23 Claims, 3 Drawing Sheets

METHOD AND MEANS FOR CONTROLLING THE FREQUENCY AND POWER OUTPUT OF A TUNABLE DIODE LASER

This invention relates to a tunable diode laser. It relates especially to a method and means for controlling the frequency and power output of such a laser.

BACKGROUND OF THE INVENTION

The wavelength of a tunable diode laser, e.g. a lead salt laser, is tuned by changing the temperature of the diode which, in turn, changes the refractive index of the diode material and thus the oscillation wavelength. Ordinarily, when this is done at frequencies above a few hertz, the heating is accomplished by changing the drive current to the diode. However, changing the drive current also varies the gain and hence the power output of the diode. In many applications, this is undesirable. For example, if such a laser is used in absorption spectrocscopy to measure the absorption of light by a trace gas, such a change in power output cause the beam modulation to include first and second harmonic signals that are unrelated to, but mimic, the absorption of the light by the trace gas.

One way to solve the above problem is to control both the wavelength and the power output of the laser as is done with some microwave sweep oscillators. Thus, it is known from the publication "Power Level Controlled Optical Sweep Oscillator Using A GaAs Semiconductor Laser" by S. Yamaguchi and M. Suzuki, IEEE Transactions On Instrumentation And Measurement, Vol. IM-36, pp. 789-796 (1977), to tune a laser by varying the laser current, while achieving power control by changing the temperature of the entire laser diode and its mounting structure. However, this approach is limited to sub-Hertz tuning because of the slowness of the temperature control.

It is also known from the publication "Photothermal Wavelength Modulation Of A Diode Laser" by C. Klimcak and J. Camparo, J. Opt. Soc. Am. B, Vol. 5, pp. 211-214 (1988), to use an external laser as a means of changing the temperature of a diode laser for purposes of tuning the diode laser. It is noted in that publication that this causes a much smaller change in power output than would ordinarily occur if the diode laser were tuned by varying its current. However, there is no teaching in that article of any form of active control of the power of the diode laser.

SUMMARY OF THE INVENTION

Accordingly, it is object of this invention to provide a system for periodically tuning the wavelength of a diode laser which minimizes changes in the power output of the laser.

Another object of the invention is to provide a controlled diode laser system which obtains independent control of the frequency and power output of the laser.

A further object of the invention is to provide such a system whose diode laser can be tuned over a relatively wide tuning range.

Another object of the invention is to provide a system of this type which controls the power output of the laser such that the power detected after transmission of the laser beam through an absorbing medium has minimum harmonic content at selected multiples of the modulation frequency even when the absorption characteristic of the absorbing medium is wavelength dependent.

Yet another object of the invention is to provide a method of controlling the frequency and power output of a diode laser which produces one or more of the above advantages.

Other objects will, in part, be obvious and will, in part, appear hereinafter.

The invention accordingly comprises the sequence of steps and the features of construction, combination of elements and arrangement of parts which will be exemplified in the following detailed description, and the scope of the invention will be indicated in the claims.

Briefly, our controlled diode laser system comprises a tunable diode laser which emits a beam of coherent light. The light propagates along a path to a detector which detects the light transmitted along the path. The diode laser is tuned to a selected wavelength and is frequency modulated by optically heating the diode junction using shorter wavelength light from a simple inexpensive heating (infrared) laser. As the amount of light incident on the diode junction increases, so does the frequency of the light emitted by the diode laser. Thus, by varying the drive current to the heating laser periodically, the diode laser can be swept in frequency.

Such optical heating of the diode laser also has an effect on the power output from that laser. However, the effect is opposite to that produced by varying the drive current to the diode laser. In other words, an increase in the light incident on the diode laser results in a decrease in that laser's power output (at constant current). Our system corrects or compensates for that amplitude variation of the transmitted light reaching the detector by controlling the power output of the diode laser such that the power detected by the detector has minimal harmonic content at selected multiples of the modulation frequency. This is referred to herein as power leveling.

This control of the power output of the diode laser is achieved by adjusting the drive current to that laser. To a first approximation, the effect is memoryless, i.e. the power output depends only on the instantaneous temperature of the diode laser. However, there is a phase shift between the diode temperature and the light intensity from the heating laser that heats the diode laser, due to the non-zero heat capacity and thermal resistance of the diode laser and the mounting thereof. To take this phase shift into account, each frequency component of the drive current correction fed back to the diode laser is corrected in phase with respect to the signal driving the heating laser.

In general, the current waveform to the diode laser may have components at all multiples of the modulation or sweep frequency of the diode laser. However, in practice, it may suffice to power level only selected components of the diode laser's output. The system described herein selects the first and second harmonics of the drive signal (i.e. f and 2f), but not the higher harmonics, for power leveling. This enables the system to maintain a substantially constant power output from the diode laser even though the beam from the diode laser to the detector passes through an absorbing medium whose absorption characteristic is wavelength dependent.

Thus by combining frequency modulation using optical heating with amplitude regulation using current control to achieve power leveling of selected harmonics of the diode laser's output, we can obtain independent control of the frequency and output power of the diode laser. Furthermore, we have demonstrated that our system can accomplish this at a scanning frequency as high as 400 Hz, which, in trace gas measurement applications, is sufficient to enable the use of second harmonic or derivative signal processing techniques.

Advantageously also, while current regulation of the diode laser serves to counteract the variation of power output with tuning, it works with the tuning to increase the frequency range, $\Delta v$, over which the diode laser is tuned. This enables the system to be used, for example, in absorption spectroscopy to measure the absorption of light by a trace gas in the free atmosphere, exhibiting pressure-broadened absorption lines.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENT

Figure 1:
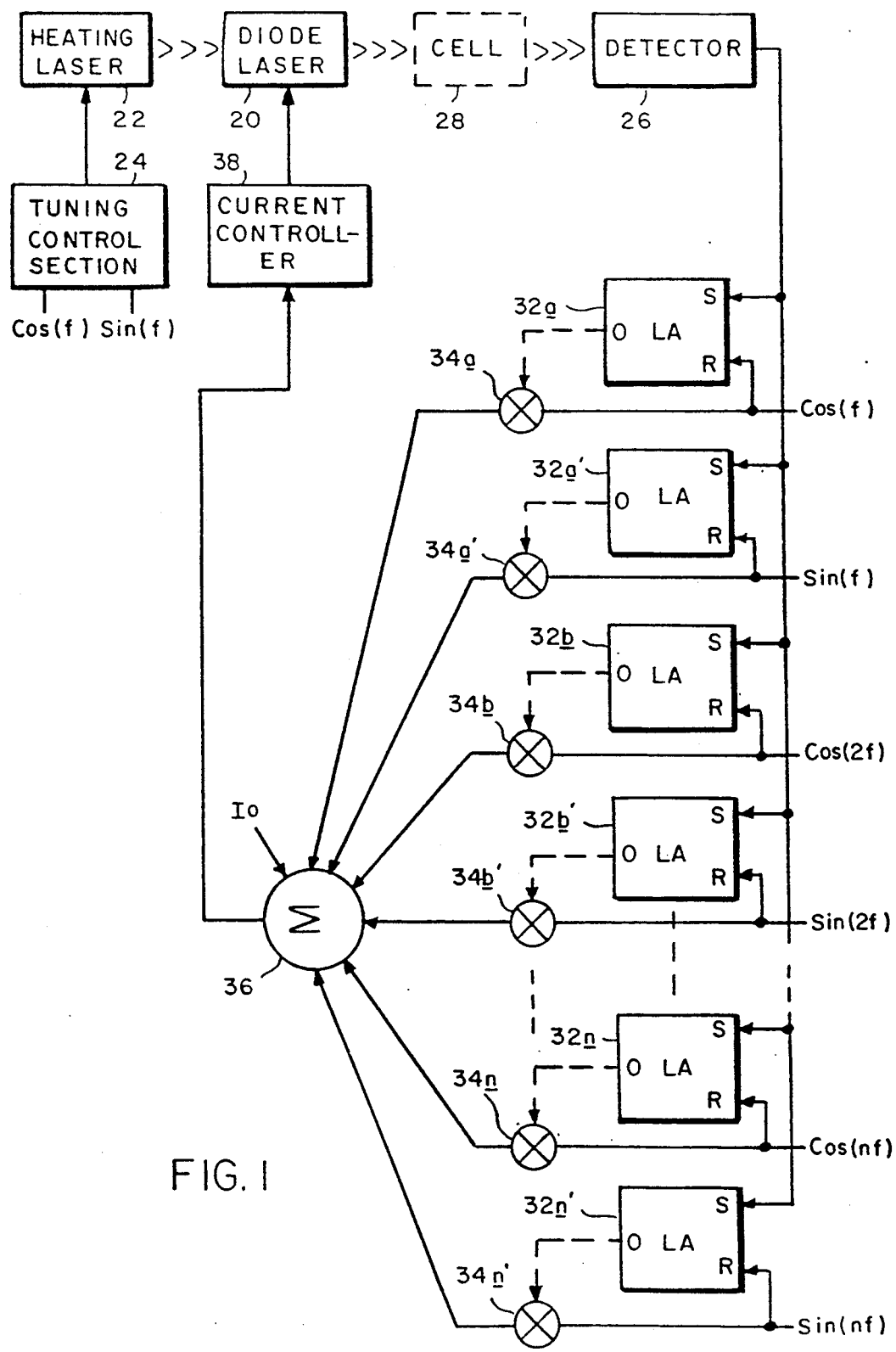
FIG. 1 is a block diagram of a controlled diode laser system incorporating our invention.

Referring to FIG. 1 of the drawings, our system includes a diode laser 20 which is heated by light from a heating laser 22. When the system is to be used in absorption spectroscopy, the diode laser is preferably a lead-salt laser that emits light in the mid-infrared spectral region, e.g. 3 to 30 micrometers, where many atmospheric trace gases have absorption features. The heating laser 22 preferably emits light in the visible or near visible region, e.g. 830 nm. A tuning control section 24 varies the power output of the heating laser 22 periodically so that the light from the heating laser 22 absorbed by the diode laser 20 tunes laser 20 in frequency over a selected frequency range.

The light from the diode laser 20 is transmitted along the path to a detector 26. That path may include an absorbing medium illustrated by the cell shown in phantom at 28 in FIG. 1.

The signal from detector 26 is demodulated synchronously by a string of lock-in amplifier pairs 32a, 32a'; 32b,32b'; 32c,32c'; ... 32n,32n' (collectively 32). For example, in the illustrated system each amplifier may be a Stanford Research Model SR 530 two-phase lock-in amplifier. Each such amplifier 32 receives the signal from the detector 26 at an input S and also a reference signal at an input R, producing a detected, low pass filtered and amplified output signal at an output O. For each of the harmonics of the diode laser's output to be minimized, e.g. f, 2f, 3f ... nf, a pair of in-phase (cos) and quadrature (sin) reference signals are applied to a pair of amplifiers 32.

For purposes of this description, we will describe specifically a system which minimizes only the first and second components of the diode laser's output. Therefore, cos(f) and sin(f) reference signals are applied to the inputs R of amplifiers 32a and 32a', respectively, while cos(2f) and sin(2f) reference signals are fed to inputs R of amplifiers 32b and 32b', respectively.

The output signals from the pairs of lock-in amplifiers 32 are applied to corresponding pairs of modulators 34a,34a'; 34b,34b'; ... 34n,34n' (collectively 34) which also receive the aforesaid cos and sin reference signal pairs. Resultantly, at the modulators 34, the amplifier output signals, amplitude modulate the reference signals and those modulated signals are combined at a summing junction 36, together with a DC current $I_0$. This combined signal is fed to a current controller 38 which drives the diode laser 20.

The gains at the lock-in amplifiers 32 are preset appropriately depending upon the threshold current and power output characteristic of the diode laser 20. In this application, the frequency response of each amplifier 32 will include both proportional and integral terms.

Figure 2:
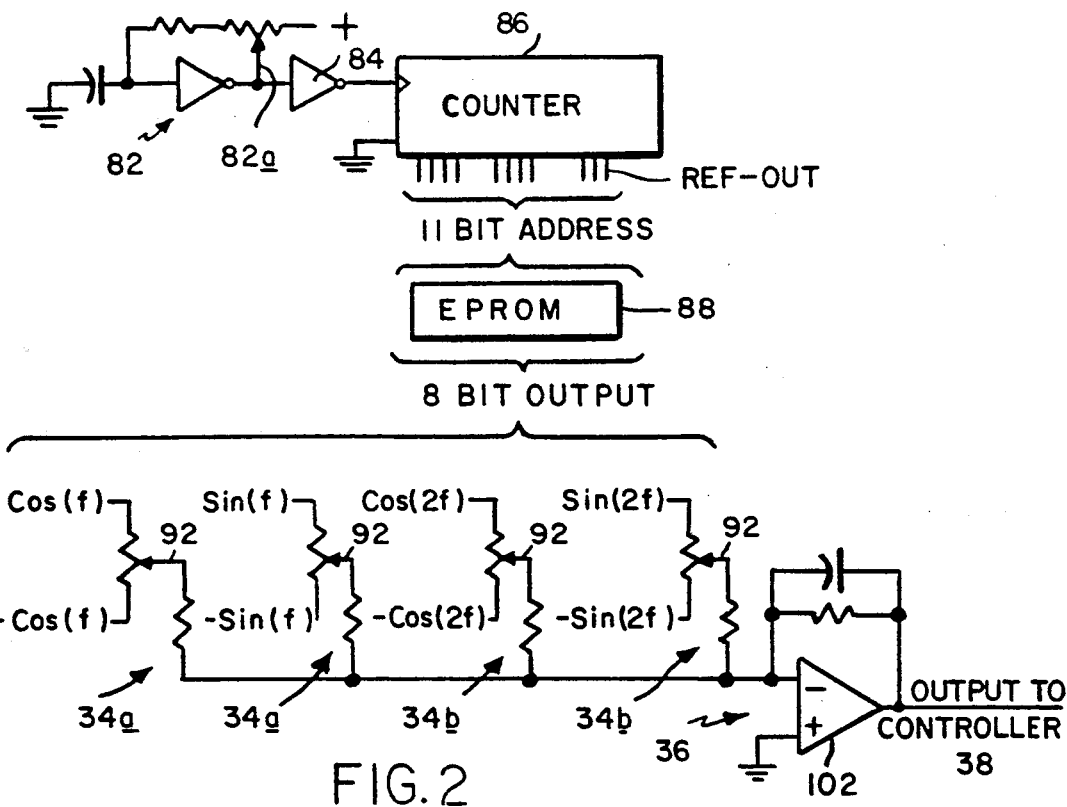
FIG. 2 is a diagrammatic view showing in greater detail the portion of the FIG. 1 system that controls the current of the diode laser.

Refer now to FIG. 2 which shows in greater detail the modulators 34, and the circuitry for producing the in-phase and quadrature reference signals applied to them and to the amplifiers 32. As seen there, a variable-frequency oscillator 82 is realized from a Schmidt-trigger logic inverter, whose frequency is adjustable by means of a potentiometer 82a over a range of about 0.43 to 1.37 mHz. After buffering by a further inverter 84, the output is applied to an 11-bit synchronous counter 86 which divides the incoming signal. The 11-bit count from counter 86 is used to address an erasable programmable read-only memory (EPROM) 88. The EPROM may be, for example, a type 27C16. Note that in the example discussed here, all the logic elements are CMOS, and thus their output voltages are accurately either 0 or the supply voltage. Consequently, they are usable as inputs to the analog portions of the system. If some other logic type were to be used, it might be necessary to buffer the logic signals to obtain an accurate (2-state) analog signal.

Memory 88 stores eight pulse-width-modulated binary representations of sinusoidal signals. The memory locations are addressed sequentially by the counter 86 so that the memory produces a series of 8-bit outputs, one bit for each signal. The output bits are paired, one bit in each pair being part of a series of $2^{11}$ (2048) bits representing a sinusoidal signal and the second bit of each pair being the complement of the first bit. The second bit is thus part of a series of bits representing the inverse of the same sinusoidal signal. The pairs of output bits are applied to the pairs of modulators 34a,34a' and 34b,34b', which in this example, are simply potentiometers 92. The outputs of the potentiometers are summed and smoothed by an amplifier 102 whose inverting input constitutes the summing junction 36.

The sinusoidal signals generated by the counter 86 and memory 88 are cos(2πft), sin(2πft), cos(4πft) and sin(4πft) and their inverses. These are the first and second harmonics, with two quadrature components, of $2^{11}$ times the frequency generated by the oscillator 82. For convenience, they are abbreviated herein as cos(f), sin(f), cos(2f), and sin(2f). By adjusting potentiometer 82a in oscillator 82, f may be adjusted over a reasonably wide range, say, 210–670 Hz. The amplitudes and phases of the signal components can be varied by adjusting the potentiometers 92.

The output signal from amplifier 102 thus contains components at f and 2f of arbitrarily adjustable phase and amplitude. This signal is applied to the current controller 38 to modulate the drive current to the diode laser 20.

Figure 3:
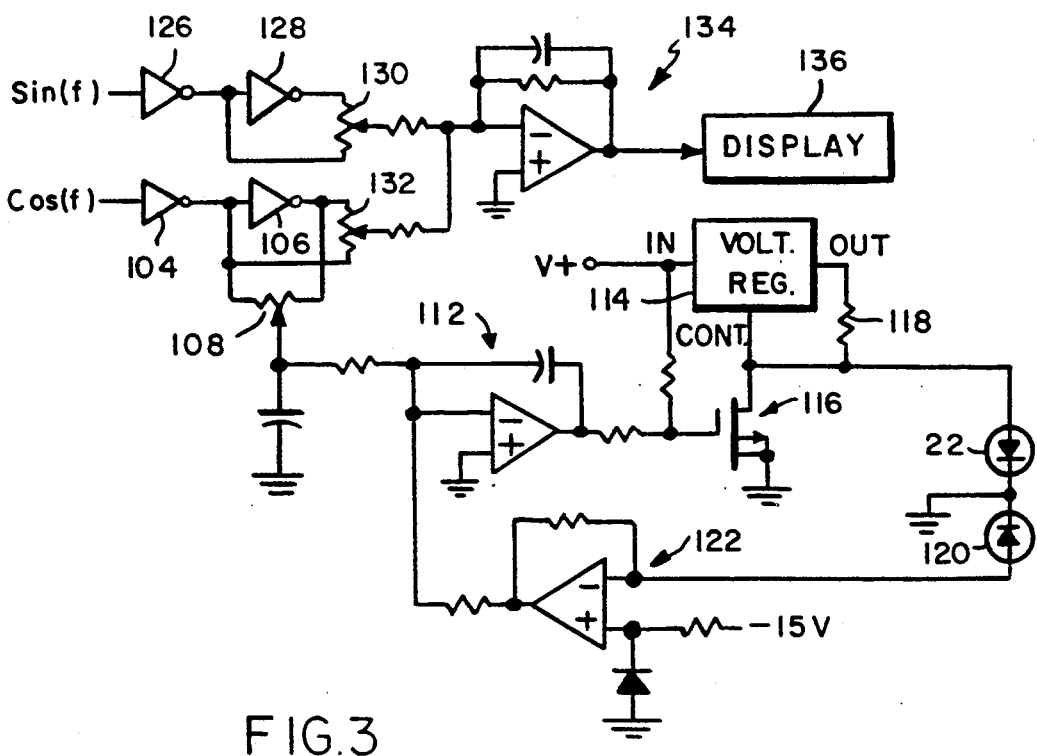
FIG. 3 is a similar view of the tuning control section of the system.

Refer now to FIG. 3 which illustrates the tuning control section 24 in detail. This section generates a periodic control signal for the heating laser 22 which has adjustable amplitude and polarity. For this, one of the binary signals from memory 88 (FIG. 2), e.g. the cos(f) signal, is applied to a pair of cascaded logic inverters 104 and 106. That signal is picked off by a potentiometer 108 connected across inverter 106, with the amplitude and polarity of that signal being controlled by adjustment of the potentiometer 108.

The cos(f) signal from potentiometer 108 is applied by way of an integrator 112 to the gate of a field effect transistor 116 having its source grounded and its drain connected to the control (CONT.) terminal of a voltage regulator 114. It will be recognized that the voltage regulator, in conjunction with a resistor 118, connected between the output of the regulator and the transistor 116 drain, functions as a current limiter. The laser 22 is connected between ground and the drain of the field effect transistor 116. The maximum current to the heating laser 22 is thus set by voltage regulator 114, while the actual current to the laser is determined by the amount shunted to ground by the transistor. For example, if the rated maximum current of laser 22 is 92 ma, the voltage regulator may provide a fixed current in the order of 85 ma. Part of this current is shunted to ground by transistor 116 which is connected in parallel with laser 22. Since the laser in this example is forward biased, it sets the drain voltage of the transistor at about 2 volts.

A monitor photodiode 120 monitors the power output of laser 22 and produces a corresponding signal which is fed back by way of a current follower 122 to the input of integrator 112 where it is subtracted from the $\cos(2\pi ft)$ signal to provide an error signal that is integrated by the integrator 112. As a result, the power output (P) of the heating laser 22 varies sinusoidally according to $P = P_0(1 + A \cos(2\pi ft))$, wherein $P_0$ is the average power and $A < 1$. The modulated beam from laser 22 tunes the diode laser 20 (FIG. 1) back and forth over a selected range $\Delta v$.

Still referring to FIG. 3, in order to enable the display of the signal detected by detector 26 (FIG. 1) as a function of the temperature of the diode laser 20 for evaluation purposes, the illustrated tuning control section 24 also provides a signal at frequency f of adjustable amplitude and phase. This display will be discussed later in connection with FIGS. 5A to 5C. For this, the sin(f) binary output from memory 88 is applied to an inverter 126, followed by a second inverter 128. The output of inverter 126 is thus −sin(f) and the output of inverter 128 is +sin(f). Accordingly, a potentiometer 130 connected across inverter 128 provides a signal ranging from +sin(f) to −sin(f). Similarly, a second potentiometer 132 connected across the inverter 106 provides a signal ranging from +cos (f) to −cos (f). These two signals are summed and low-pass-filtered by a filter amplifier 134, with the output of that amplifier being applied to the horizontal deflection input of a suitable oscilloscope display 136. Thus, by adjustment of the potentiometers 130 and 132, one may obtain a full range of phases for the CRT horizontal deflections.

In a test to determine the optimum frequency f for modulating the heating laser 22 power output, and thus for tuning the diode laser 20, the diode laser 20 was operated well away from atmospheric absorption lines at a current just above its threshold. The modulation frequency of the heating laser 22 in the particular system under test was varied by adjusting potentiometer 82a of oscillator 82 and the magnitude and phase of the resulting signal from detector 26 was recorded. The magnitude fell to 0.707 of its initial value at f=260 Hz, at which point the phase shift was 80°. At f=470 Hz, the magnitude was half its initial value and the phase shift was 105°. Therefore, a reasonable upper limit for modulation frequency f was found to be 400 Hz, beyond which the modulation decreases rapidly. The particular heating laser 22 under test had a maximum power output of 18 mW, but a peak output of only 5.5 mW gave the diode laser 20 the required tuning range $\Delta v$.

In the present example, the lock-in pairs 32a,32a′ and 32b,32b′ were realized using the aforementioned SR 530 two-phase lock-in, with a single reference input. The phase shift of the lock-in's axes was set so that one modulator, i.e. 34a in FIG. 2, changes mainly the output of amplifier 32a, while the other modulator 34a′ for that harmonic changes the output of amplifier 32a′. Then, those same modulators (potentiometers 92) are adjusted manually so that the outputs of amplifiers 32a and 32a′ are zero.

Next, the phase shifts of the second pair of amplifiers 32b,32b′ receiving the harmonic 2f are adjusted in a similar manner so that the modulator 34b changes mainly the output of amplifier 32b, while the modulator 34b′ changes the output of amplifier 32b′, after which those modulators (potentiometers 92) are adjusted manually until the outputs of amplifiers 32b and 32b′ are zero. This process is repeated until the outputs of all amplifiers 32 are essentially zero. Usually after a second iteration, the f and 2f signals will both be less than 1% of their initial values.

Finally, the reference phase to each amplifier 32, i.e. at its input R, is readjusted so that the response of the system produces outputs predominantly from amplifiers 32a and 32b, i.e. in-phase (cos) component outputs.

Thus, the circuit arrangement shown in FIG. 2, along with the lock-in amplifiers 32, comprises a manual servosystem which synchronously demodulates the detector 26 signal, with the operator noting the outputs from amplifiers 32 and appropriately manually adjusting the modulators (potentiometers 92) to reduce the f and 2f components of the diode laser beam modulation to zero. Resultantly, the power output of diode laser 20 varies only minimally due to the intrinsic properties of that laser as the laser is tuned in frequency. Furthermore, the power output remains constant even though the beam from laser 20 passes through an absorbing medium whose absorption characteristic is wavelength dependent.

Figure 4:
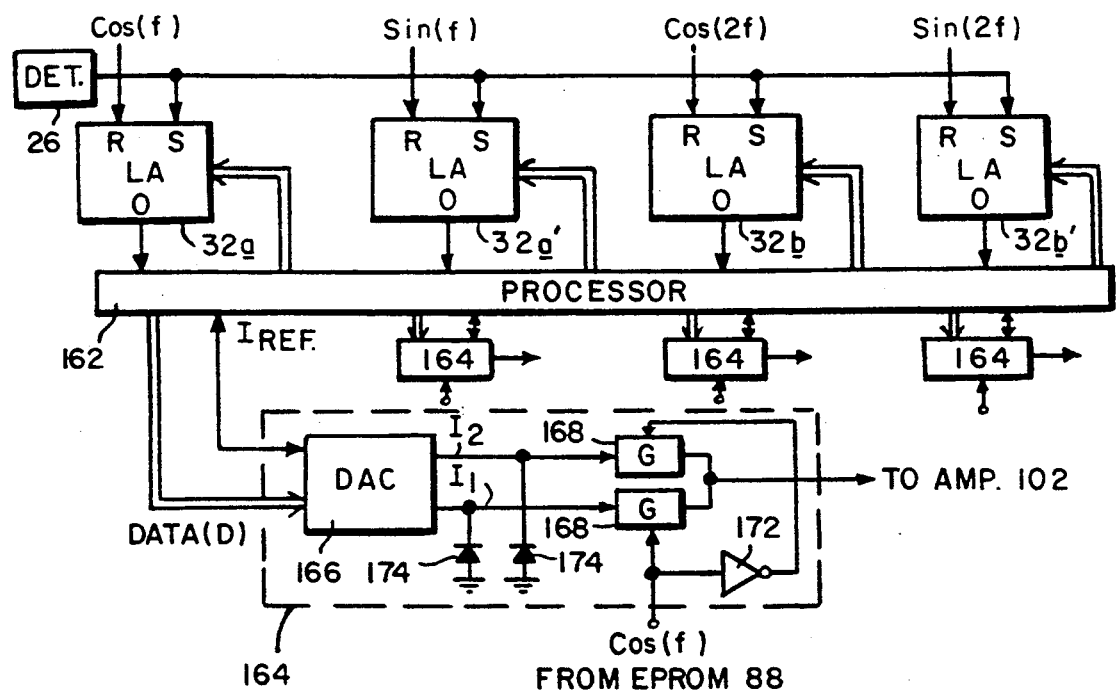
FIG. 4 is a block diagram showing a computerized current controller for the FIG. 1 system.

Referring to FIG. 4, if desired, the manually operated servosystem just described may be substituted for by a computerized version having a processor 162 which can set the gain and time constant for each amplifier 32, select the desired harmonic, e.g. f or 2f, and acquire the in-phase and quadrature readings at the amplifier 32 outputs. In this computerized version, each of the modulators 34, may be replaced by a digital-to-analog converter (DAC)-based modulator 164 for controlling the current signal to diode laser 20.

One of these modulators 164, corresponding to modulator 34a in FIG. 1, is shown in detail in FIG. 4. It comprises a DAC 166 whose output terminals are connected via a pair of gates 168 to summing amplifier 102. A bit from memory 88 (FIG. 2), i.e. cos (f), is applied to the control terminal of one gate and, by way of an inverter 172, to the control terminal of the other gate, to operate the two gates 168 180° out of phase. Gates 168 connect the current output from DAC 166 either to the amplifier 102 or to ground through the diodes 174, depending upon the value of that cos (f) bit.

The average value of the bit is $\alpha = 0.5 + A$, where $-0.5 \geq A \geq 0.5$, while the average value of the complement of that bit is $(1-\alpha) = 0.5 - A$. This average value represents the fraction of the time that the bit is high at a given point in the pulse width-modulated approximation of the sinusoidal waveforms from memory 88. For each current-output DAC 166, $I_1 = I_{REF} (0.5 + D)$, while $I_2 = I_{REF} (0.5 - D)$, where $-0.5 \geq D \geq 0.5$ is the digital input to the DAC. Accordingly, the average current I to amplifier 102 from this modulator 164 may be expressed as $$I = I_{REF} [(0.5 + A)(0.5 + D) + (0.5 - A)(0.5 - D)]$$

$$I = I_{REF} (0.5 - 2AD)$$

Thus, the data input D to modulator 164 has the same effect as the operator setting potentiometer 92 comprising modulator 34a.

Similar modulators 164 may be provided in lieu of the three other potentiometer-type modulators 34a', 34b and 3b' to provide the sin (f), cos (2f) and sin (2f) inputs to amplifier 102.

Figure 5A:
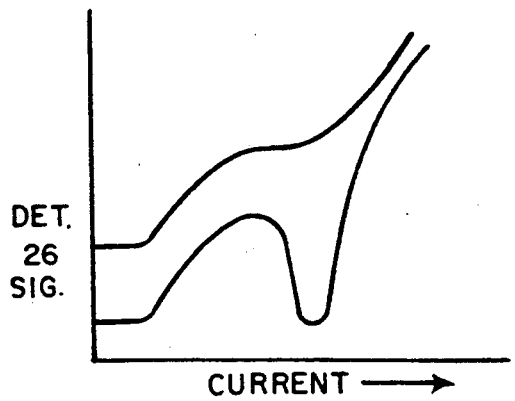
FIGS. 5A to 5C are graphical diagrams illustrating the operation of the FIG. 1 system.
Figure 5B:
Figure 5C:
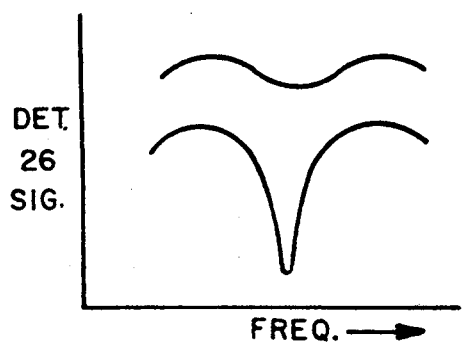

Refer now to FIGS. 5A to 5C which illustrate the beneficial effect on the signal from detector 26 when the diode laser 20 is tuned by optical heating and its beam is power leveled in accordance with the invention. To produce the waveforms shown there, a cell 28 (FIG. 1) was placed in the path of the beam from diode laser 20 and that laser was tuned to the center of a strong water absorption line, near 5.3 micrometers. The modulation or sweep frequency f established by oscillator 82 was set to 400 Hz. FIGS. 5A to 5C show the detector 26 output displayed by the display 38 (FIG. 3) under three typical operating conditions. In each case, the cell 28 contained either dry air (upper trace) or water vapor at a pressure of about 15 TORR (lower trace).

To produce the waveforms in FIG. 5A, the diode laser 20 was tuned by varying only its drive current, using a sawtooth-modulated current signal. In other words, heating laser 22 was disabled. Note that the power output of laser 20, i.e. the detector 26 signal, increased rapidly with current, and that even with dry air in the test cell (upper trace), there was a broad absorption line due to water vapor in the atmosphere along the portions of the path of the laser beam outside the cell 28.

In FIGS. 5B and 5C, the horizontal axis represents the detector 26 signal as a function of diode laser 20 frequency, with adjustable amplitude and fixed phase from the amplifier 134 in FIG. 3. To allow for the phase lag between light input to diode laser 20 and the temperature change of that laser, the phase of the detector signal was adjusted by potentiometers 130 and 132 until the lower traces in FIGS. 5B and 5C coincided on both the trace and retrace of each scan. This form of display presumes that the temperature variation of diode laser 20 is sinusoidal at frequency f. However, since at least some current at frequency 2f is applied to the laser, this assumption is only approximately valid, the degree of validity determining the extent to which each trace is single-valued.

To produce the waveforms in FIG. 5B, the tuning control section 24 in FIG. 3 was used to tune diode laser 20 by infrared heating only; i.e. there was no power leveling by the circuit shown in FIG. 2. Note that in this case, both the upper and lower traces show that the power output from diode laser 20 decreased with increasing frequency. Since the frequency varies directly with the temperature, this figure also shows that the power decreased with increasing temperature, contrary to the FIG. 5A example in which the laser 20 was tuned by Varying its current only.

In FIG. 5C, the FIG. 2 circuit was used to control the current to laser 20 to force the f and 2f components thereof to zero. Note that this results in a significant decrease in the peak-to-peak signal excursions of both traces, compared to those produced by either tuning by current only (FIG. 5A) or by infrared only (FIG. 5B). This means that the dynamic range of the signal processing components comprising the system can be minimized. Also, comparisons of FIG. 5C with FIGS. 5A and 5B show that current regulation of diode laser 20 to achieve power leveling definitely counteracts the variation in the power output of diode laser 20 with tuning, i.e. the FIG. 5C waveforms are more or less symmetrical about a vertical axis. Moreover, the narrower width of the lower pressure water line (lower trace) in FIG. 5C shows that such current regulation works with the optical tuning of diode laser 20 to maximize the range $\Delta \nu$ that is scanned by that laser. Indeed, with power leveling, that range is sufficiently broad as to include the widths of the atmospheric pressure-broadened absorption lines of most atmospheric trace gases, i.e. 0.1 to 0.2 cm$^{-1}$. Therefore, the present system may be used in absorption spectroscopy conducted in the free atmosphere exhibiting pressure broadened absorption lines to minimize the second harmonic component of the diode laser output which mimics, but is unrelated to, the absorption of the laser light by the trace gas of interest. Thus, our system can enhance the detection sensitivity for small changes in the concentration of the absorbing species in the sample being tested.

It will thus be seen that the objects set forth above, among those made apparent from the preceding description, are efficiently attained. Also, certain changes may be made in the above construction without departing from the scope of the invention. For example, instead of varying the power to heating laser 22 in order to tune the diode laser 20, the intensity of the radiation beam from the heating laser may be modulated directly using a variable polarizing device, for example. Also, the heating may be accomplished by a non-laser source, such as a light emitting diode or even a small lamp. Therefore, it is intended that all matter contained in the above description or shown in the accompanying drawings shall be interpreted as illustrative and not in a limiting sense.

It is also to be understood that the following claims are intended to cover all of the generic and specific features of the invention herein described.

We claim:

1. A tunable diode laser system with frequency and power control, said system comprising
   a tunable diode laser for providing a beam of coherent light having a lasing frequency;
   driver means for providing drive current to the diode laser;
   detector means spaced from the diode laser for detecting the light transmitted along the beam path between the diode laser and the detector means and producing a corresponding output signal in response thereto;

means for providing radiation to said diode laser to heat, and thereby to change the frequency of, the diode laser;

means for producing a tuning signal having a selected tuning frequency;

tuning means responsive to the tuning signal for periodically varying at the selected tuning frequency the amplitude of the radiation incident on said diode laser thereby to frequency-modulate the diode laser beam over a selected tuning range, and means responsive to the detector means output signal for controlling the driver means to regulate the drive current to said diode laser to minimize selected frequency components of the modulated light beam from the diode laser whereby the power output of the diode laser varies minimally when the diode laser is tuned over said selected tuning range.

2. The system defined in claim 1 wherein said selected tuning range has a center frequency corresponding to said lasing frequency.

3. The system defined in claim 2 wherein said selected frequency components include the first and second harmonics of said tuning frequency.

4. The system defined in claim 1 wherein said diode laser emits a beam of light in the infrared spectral region.

5. The system defined in claim 4, wherein said diode laser is a lead-salt laser whose emitted light has a wavelength of 3 to 30 micrometers.

6. The system defined in claim 1 wherein said radiation providing means comprise a heating laser which emits a beam of coherent light to the diode laser having a wavelength appreciably shorter than that of the light from the diode laser.

7. The system defined in claim 6 wherein said heating laser is composed of elements from Groups III and V of the periodic table, and whose emitted light has a wavelength of 780 to 830 nanometers.

8. The system defined in claim 1 and further including a test cell in the diode laser beam path for containing a gaseous sample.

9. The system defined in claim 1 wherein the tuning means comprise means for adjusting the amplitude and polarity of the tuning signal to produce an adjusted tuning signal;

means for monitoring the power output of the heating laser and producing a corresponding power indicating signal;

means responsive to the adjusted tuning signal and the power indicating signal to produce an error signal, and current regulating means responsive to said error signal for producing a drive signal to the heating laser having a fixed component and a sinusoidal component so that the power output (P) of the heating laser varies according to $P = P_0 (1 + A \cos(2\pi ft))$, where $P_0$ is the average power output of the heating laser, A is an integer less than 1 and f is the tuning frequency.

10. The system defined in claim 9 and further including means for digitizing the tuning signal applied to said adjusting means.

11. The system defined in claim 1 wherein the driver controlling means include means for synchronously demodulating the detector output signal.

12. The system defined in claim 1 wherein the driver controlling means include means responsive to said tuning signal for producing in-phase and quadrature harmonics corresponding to said selected frequency components, and means for applying said harmonics as a control signal to the driver means, said applying means including means for regulating the amplitudes and phases of said harmonics so that said selected frequency components are a minimum in the light detected by the detecting means.

13. The system defined in claim 12 wherein said harmonic producing means include means for digitizing the tuning signal in the course of producing said harmonics.

14. The system defined in claim 13 wherein the harmonic producing means include memory means for storing pulse-width-modulated binary representations of sinusoidal signals corresponding to said harmonics;

means responsive to the tuning signal for addressing the memory means so that the memory means output to said applying means are digital representations of said harmonics.

15. The system defined in claim 14 wherein said memory means comprise a read only memory (ROM).

16. The system defined in claim 14 wherein said harmonic producing means produce, and said memory means store, digital representations of the first and second harmonics with their quadratures and inverses of said selected tuning frequency.

17. The system defined in claim 12 wherein said applying means comprise a pair of lock-in amplifiers corresponding to each of said selected frequency components;

means for applying the detector output signal to each of said amplifiers;

means for applying the in-phase and quadrature harmonics, respectively, of said selected frequency components to the corresponding pairs of amplifiers;

a regulator receiving each of said harmonics and producing a regulated output signal;

means for summing the output signals from all of said regulators, and means for coupling the output of the summing means as said control signal to the drive means.

18. The system defined in claim 17 wherein said regulators comprise a set of potentiometers.

19. The system defined in claim 17 wherein said regulators comprise a set of digital-to-analog converters (DACs), and processor means for controlling the converters.

20. A method of controlling a tunable diode laser that provides a beam of coherent light having a selected lasing frequency, said method comprising the steps of providing a drive current to the diode laser;

detecting the light transmitted along a beam path and producing an output signal in response thereto;

providing radiation to the diode laser to heat, and thereby to change the frequency of, the diode laser;

producing a tuning signal having a selected tuning frequency;

periodically varying at the selected tuning frequency the amplitude of the radiation incident on the diode laser to frequency-modulate the diode laser beam over a selected tuning range, and controlling the drive current to the diode laser to minimize selected frequency components of the modulated light beam from the diode laser so that the power output of the diode laser varies minimally when the diode laser is tuned over said selected tuning range.

21. The method defined in claim 20 wherein the radiation is provided to the diode laser by illuminating the diode laser with a beam of coherent light from a heating laser having a wavelength appreciably shorter than that of the light from the diode laser.

22. The method defined in claim 21 wherein the amplitude of the radiation incident on the diode laser is periodically varied by adjusting the amplitude and polarity of the tuning signal to produce an adjusted tuning signal;

monitoring the power output of the heating laser provided to the diode laser to produce a corresponding power-indicating signal;

producing from the adjusted tuning signal and the power-indicating signal, an error signal, and producing from said error signal a drive signal to the heating laser having a fixed component and a sinusoidal component so that the power output (P) of the heating laser varies according to $P=P_0(1+A\cos(2\pi ft))$, where $P_0$ is the average power output of the heating laser, A is an integer less than 1 and f is the tuning frequency.

23. The method defined in claim 21 wherein the drive current to the heating laser is controlled by producing in-phase and quadrature harmonics corresponding to said selected frequency components, applying said harmonics to control the drive current to the diode laser, and regulating the amplitude and phases of said harmonics so that said selected frequency components are a minimum in the detected light from the diode laser.

* * * * *